(12) United States Patent
Choi

(10) Patent No.: US 7,625,816 B2
(45) Date of Patent: Dec. 1, 2009

(54) METHOD OF FABRICATING PASSIVATION

(75) Inventor: Yong Keon Choi, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 511 days.

(21) Appl. No.: 11/617,330

(22) Filed: Dec. 28, 2006

(65) Prior Publication Data

US 2007/0152304 A1 Jul. 5, 2007

(30) Foreign Application Priority Data

Dec. 30, 2005 (KR) .................... 10-2005-0134797

(51) Int. Cl.
*H01L 21/44* (2006.01)
(52) U.S. Cl. .................. 438/613; 438/612; 438/614; 438/626; 438/631; 438/633; 257/E21.56; 257/E21.59; 257/E21.627; 257/734; 257/748; 257/752; 257/780
(58) Field of Classification Search ............... 438/612, 438/613, 614
See application file for complete search history.

(56) References Cited

U.S. PATENT DOCUMENTS 6,667,230 B2 * 12/2003 Chen et al. ............... 438/613
7,282,433 B2 * 10/2007 Tang et al. ............... 438/614

* cited by examiner

*Primary Examiner*—Dao H Nguyen
(74) *Attorney, Agent, or Firm*—Sherr & Vaughn, PLLC

(57) ABSTRACT

Embodiments relate to a passivation fabricating method. In the passivation fabricating method according to embodiments, a first oxide film may be formed by repeating deposition and etching of an oxide film on a silicon substrate in which an upper metal pad may be formed and a second oxide film may be formed by performing only deposition on the first oxide film. A thickness of the first oxide film may be set to be above 5 kÅ. A first passivation layer may be formed by planarizing the first and second oxide films. In the planarizing process, a thickness of the first passivation layer may be 4 kÅ. A second passivation layer of a nitride film may be formed on the first passivation layer and the first and second passivations may be selectively etched so as to expose the upper metal pad.

12 Claims, 3 Drawing Sheets

METHOD OF FABRICATING PASSIVATION

The present application claims priority under 35 U.S.C. 119 and 35 U.S.C. 365 to Korean Patent Application No. 10-2005-0134797 (filed on Dec. 30, 2005), which is hereby incorporated by reference in its entirety.

BACKGROUND

In a FAB (Fabrication) process, an electronic circuit may be formed by patterning a semiconductor device on a silicon substrate. Since the device formed through the FAB process may be sensitive to impurities, as shown in FIG. 1, passivation 3 may be coated, and may protect the device from external factors.

Passivation 3 may not be coated on an upper metal pad 8 because electrode terminal 5 may be formed on upper metal pad 8. Electrode terminal 5 may be provided to electrically connect upper metal pad 8 to the outside, for example to receive a voltage operating the device of the semiconductor substrate.

Electrode terminal 5 may be formed low in a region in which the passivation is not coated according to a related art pattern step. Consequentially, a dimple phenomenon may be caused. A dimple phenomenon may be where a recess is caused in central portion A of electrode 5.

If the dimple phenomenon is generated in electrode terminal 5, the bonding area between electrode terminal 5 and a packaging module may be reduced in the process of packaging the silicon substrate. This may increase a resistance. To improve the dimple phenomenon, a method for lowering the height of the passivation may be used. However, if the height of the passivation is too low, a gap fill phenomenon of an upper metal may be generated.

SUMMARY

Embodiments relate to a passivation fabricating method. Embodiments relate to a passivation fabricating method that may be capable of improving a dimple phenomenon of an electrode terminal formed in an upper electrode pad.

Embodiments relate to a passivation forming method that may be capable of improving a dimple phenomenon generated in the process of forming an electrode terminal due to a step height of a passivation.

In embodiments, the passivation fabricating method may include a first oxide film, which may be formed by repeating deposition and etching of an oxide film on a silicon substrate in which an upper metal pad may be formed and a second oxide film may be formed by performing only deposition on the first oxide film. Then, the thickness of the first oxide film may be set to above 5 kÅ. A first passivation may be formed by planarizing the first and second oxide films. In the planarizing process, the thickness of the first passivation may be 4 kÅ. A second passivation of a nitride film may be formed on the first passivation and the first and second passivations may be selectively etched so as to expose the upper metal pad.

DETAILED DESCRIPTION OF EMBODIMENTS

FIGS. 2a to 2g are diagrams illustrating a method of fabricating a semiconductor according to embodiments.

Metal pad 28 may be formed on silicon substrate 22. A plurality of integrated circuits or a single integrated circuit device may be formed on an upper portion of silicon substrate 22. Metal pad 28 may be an input/output pad and may be an connection pad for electrical connection to the outside, for example to receive a voltage required to drive a device and an output voltage of the device.

In the semiconductor device formed by a FAB process, a passivation layer may be formed. The passivation layer may protect the device from exterior foreign substances In embodiments, the passivation layer may be formed of an oxide film and/or a nitride film. In embodiments, the oxide film may be formed by an HDP method and/or a TEOS method.

Figure 1:
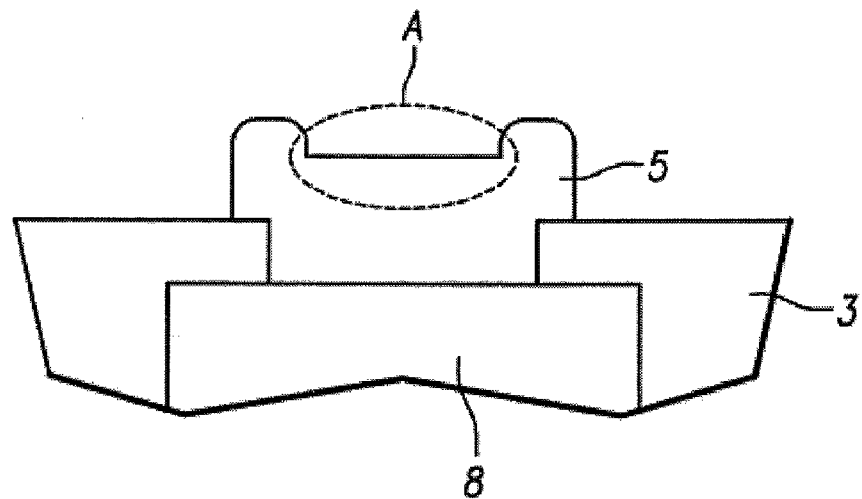
FIG. 1 is an example cross-sectional diagram illustrating a dimple phenomenon of an electrode terminal formed in an upper metal pad.
Figure 2A:
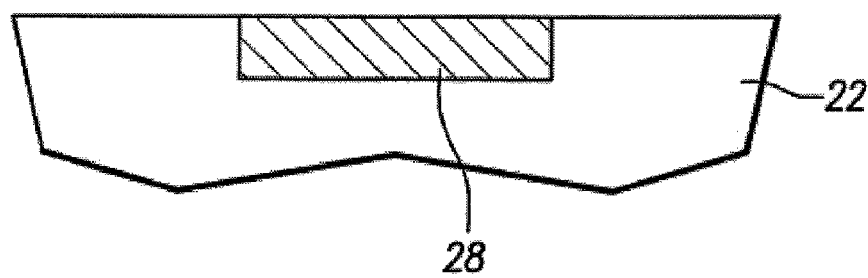
FIGS. 2a to 2g are example cross-sectional diagrams illustrating a passivation fabricating method according to embodiments.
Figure 2B:
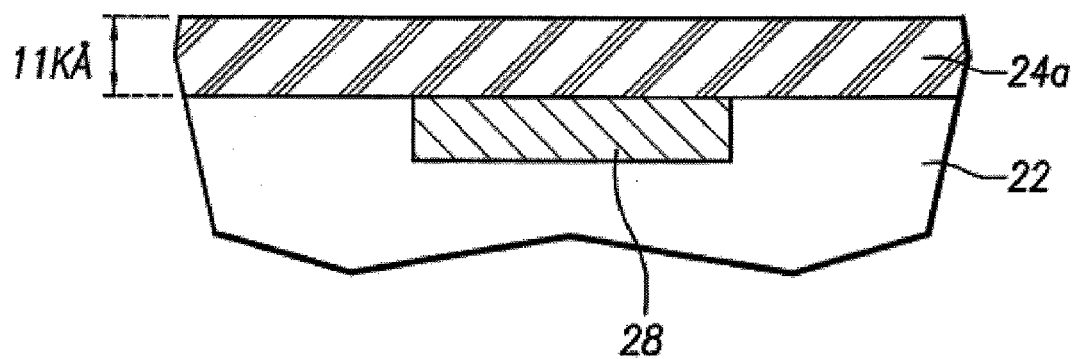

Referring to FIG. 2b, first oxide film 24a may be formed using the HDP method in which deposition and etching of an oxide film may be repetitively performed to improve the gap fill capacity of the first oxide film 24a.

A thickness of first oxide film 24a may be set to a height greater than 5 kÅ. In embodiments, the thickness first oxide film 24a may be approximately 11 kÅ.

Figure 2C:
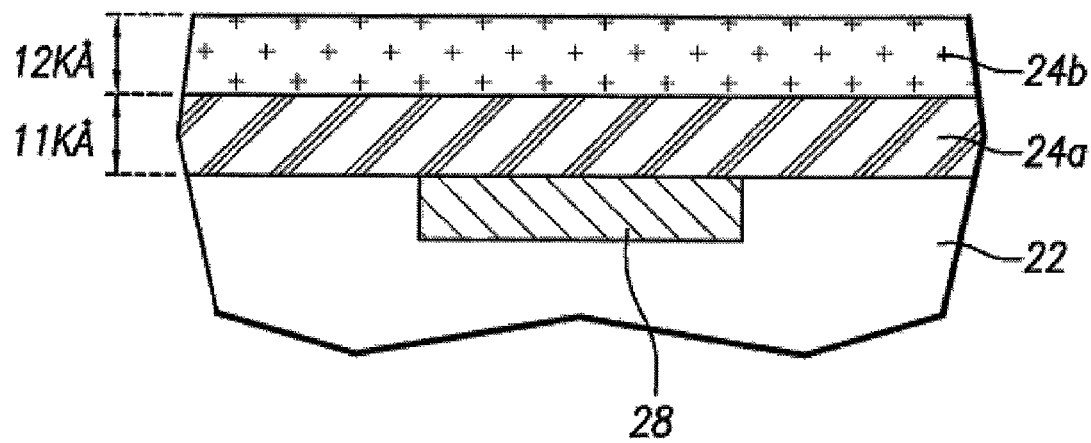

Referring to FIG. 2c, second oxide film 24b may be formed, for example using the TEOS method performing only a deposition process.

A CMP (Chemical Mechanical polishing) process may then be performed. Considering the margin of the CMP, a thickness of the second oxide film 24b may be set to 12 kÅ.

After first and second oxide films 24a and 24b may be formed, the first and second oxide films 24a and 24b may be planarized through the CMP process. This may regulate a thicknesses of the oxide films 24a and 24b.

Figure 2D:
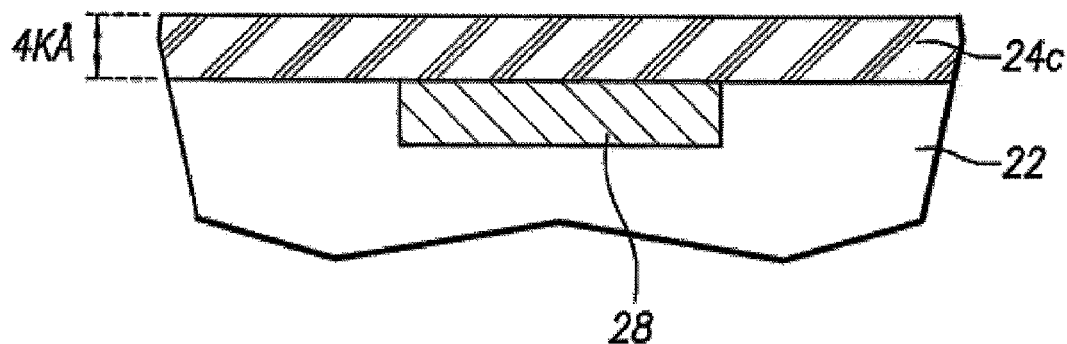

A thickness of residual oxide film 24c after the CMP process may be less than approximately 10 kÅ. In embodiments, as shown in FIG. 2d, a thickness of residual oxide film 24c may be approximately 4 kÅ. Residual oxide film 24c which is the first passivation layer.

If a height of residual oxide film 24c is unconditionally lowered to remove a dimple phenomenon that may be generated in the process of forming an electrode terminal on metal pad 28, then a gap fill phenomenon of the upper metal may be generated.

Figure 2E:
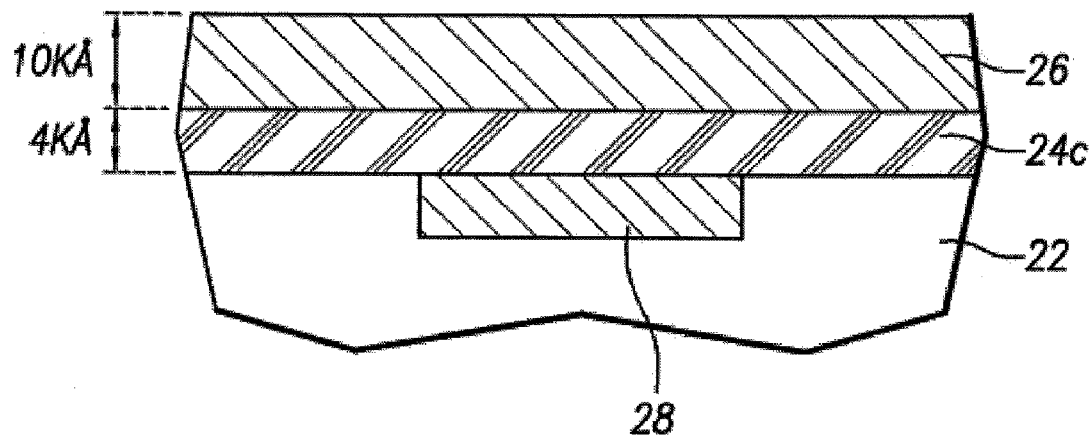

Referring to FIG. 2e, a second passivation layer of nitride film 26 may be formed on first passivation 24c. This may correct the gap fill phenomenon.

Nitride film 26, which is the second passivation layer, may be formed so that the sum of the thickness of first passivation layer 24c and the thickness of nitride film 26 may be less than approximately 15 kÅ. In embodiments, since the thickness of the residual oxide film 24c is set to be approximately 4 kÅ, nitride film 26 may have a thickness of approximately 10 kÅ.

Figure 2F:
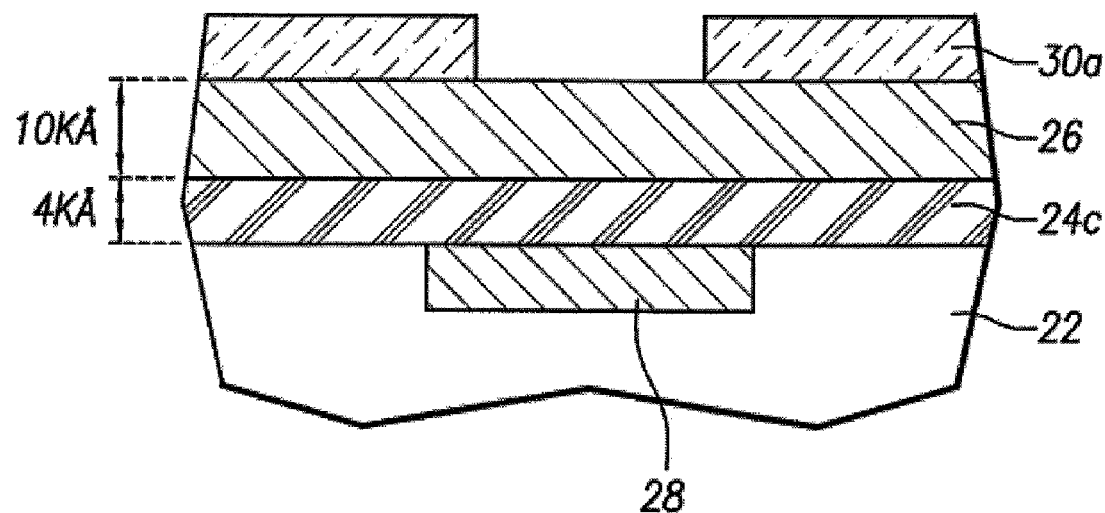

Referring to FIG. 2f, photoresist pattern 30a may be formed on nitride film 26. Photoresist pattern 30a may be formed to expose metal pad 28 by selectively etching residual oxide film 24c and nitride film 26.

Figure 2G:
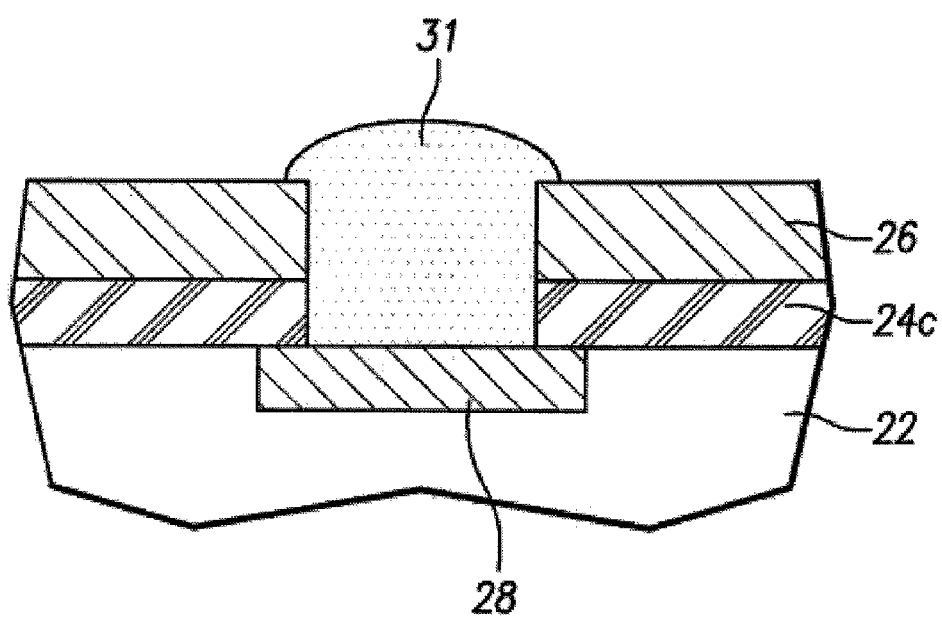

Referring to FIG. 2g, residual oxide film 24c and nitride film 26 may be selectively etched. Photoresist pattern 30a may serve as a mask for the selective etching.

Referring to FIG. 2h, metal terminal 31 may be formed.

In embodiments, a dimple phenomenon of an electrode terminal may be removed.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a first oxide layer over a silicon substrate in which a metal pad is formed;
   forming a second oxide layer over the first oxide layer;
   forming a first passivation layer by planarizing the first and second oxide layers;
   forming a second passivation over the first passivation layer; and
   selectively etching the first and second passivation layers to expose the upper metal pad.

2. The method of claim 1, wherein first oxide layer is formed by repeating deposition and etching of oxide films.

3. The method of claim 2, wherein the second passivation layer comprises a nitride layer.

4. The method of claim 1, wherein the first oxide layer has a thickness of greater than approximately 5 kÅ.

5. The method of claim 4, wherein the first oxide layer has a thickness of approximately 11 kÅ and the second oxide layer has a thickness of approximately 12 kÅ.

6. The method of claim 5, wherein the first oxide layer is formed by an HDP process and the second oxide layer is formed by a TEOS process, and planarizing the first and second oxide layers comprises performing a Chemical Mechanical Polishing (CMP).

7. The method of claim 6, wherein the first and second oxide layers are planarized to a thickness of approximately 4 kÅ.

8. The method of claim 1, wherein forming the first passivation layer comprises performing the planarization so that a thickness of the first passivation layer is approximately 4 kÅ.

9. The method of claim 1, wherein a sum of thicknesses of the first and second passivation layers is less than approximately 15 kÅ.

10. The method of claim 1, wherein a thickness of the first passivation layer is approximately 4 kÅ and a thickness of the second passivation layer is approximately 10 kÅ.

11. The method of claim 1, further comprising forming a metal connector in the etched portion of the first and second passivation layers, the metal connector being in electrical contact with the metal pad.

12. The method of claim 11, wherein a top surface of the metal connector is formed to be above a top surface of the second passivation layer.

* * * * *